(12) United States Patent
Ahmed et al.

(10) Patent No.: US 9,431,485 B2
(45) Date of Patent: Aug. 30, 2016

(54) FORMATION OF FINFET JUNCTION

(71) Applicant: GLOBALFOUNDRIES INC., Grand Cayman (KY)

(72) Inventors: Shafaat Ahmed, Newburgh, NY (US); Murshed M. Chowdhury, Fremont, CA (US); Aritra Dasgupta, Wappingers Falls, NY (US); Mohammad Hasanuzzaman, Beacon, NY (US); Shahrukh Akbar Khan, Danbury, CT (US); Joyeeta Nag, Wappingers Falls, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/580,274

(22) Filed: Dec. 23, 2014

(65) Prior Publication Data

US 2016/0181367 A1    Jun. 23, 2016

(51) Int. Cl.
*H01L 21/265* (2006.01)
*H01L 29/10* (2006.01)
*H01L 29/66* (2006.01)
*H01L 29/78* (2006.01)

(52) U.S. Cl.
CPC ......... *H01L 29/1045* (2013.01); *H01L 21/265* (2013.01); *H01L 29/66545* (2013.01); *H01L 29/66553* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 7,704,833 B2 | 4/2010 | Lindert et al. | |
| 7,763,542 B2 | 7/2010 | Kim et al. | |
| 7,943,992 B2 | 5/2011 | Sell et al. | |
| 7,951,673 B2 | 5/2011 | Lindert et al. | |
| 8,679,910 B2 * | 3/2014 | Ming | H01L 21/823807 438/224 |
| 8,691,650 B2 | 4/2014 | Cheng et al. | |
| 2009/0302398 A1 | 12/2009 | Sell et al. | |
| 2010/0052057 A1 * | 3/2010 | Chung | H01L 29/0634 257/362 |
| 2012/0049293 A1 * | 3/2012 | Scheiper | H01L 21/26506 257/392 |
| 2013/0134506 A1 * | 5/2013 | Yagishita | H01L 29/66545 257/330 |
| 2013/0260561 A1 | 10/2013 | Ranjan et al. | |
| 2013/0277746 A1 * | 10/2013 | Baldauf | H01L 21/823807 257/368 |

* cited by examiner

*Primary Examiner* — Evren Seven
*Assistant Examiner* — Steven Christopher
(74) *Attorney, Agent, or Firm* — Hoffman Warnick LLC; Yuanmin Cai

(57) ABSTRACT

A method of forming a finFET structure having an ion implanted intermediate region next to the channel region of a finFET gate. The intermediate region is formed in a manner to reduce or eliminate migration of the dopant to undoped regions of the finFET thus forming abrupt finFET junction.

16 Claims, 4 Drawing Sheets

US 9,431,485 B2

FORMATION OF FINFET JUNCTION

BACKGROUND

The present invention relates to semiconductor devices, and particularly to forming source/drain regions, and forming abrupt Fin Field Effect Transistor (FinFET) junctions.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region.

FinFETs are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are often fabricated on the same substrate.

BRIEF SUMMARY

An embodiment of the invention may include a method for forming a semiconductor structure. The method may include forming a dummy gate over a gate region of a fin. The dummy gate may contain a dummy dielectric layer in direct contact with the fin and a dummy material above the dummy dielectric layer. A spacer pair may be formed sandwiching the dummy gate. A dummy spacer pair may be formed adjacent to the spacer pair. The dummy spacer may sandwich the gate and the spacer pair. The dummy spacer may be located above an intermediate region of the fin. An epi-layer may be formed above a source/drain region of the fin. The epi-layer may be in direct contact with the dummy spacer pair and the source/drain region may be adjacent to the intermediate region of the fin. The dummy materials may be removed to form a gate void. A replacement gate may be formed in the gate void. The replacement gate may contain a dielectric layer, work function (WF) metal layers and an electrode. The dummy spacer pair may be removed to form an implantation void. At least one dopant may be implanted into the intermediate region through the implantation void. The implantation void may be filled with an insulating material to form an insulating layer. The at least one dopant in the intermediate region may be activated.

An additional embodiment of the invention may include a method for forming a semiconductor structure. The method may include forming a fin on a semiconductor substrate. The fin may include a gate region of the fin, a spacer region, an intermediate region of the fin and a source/drain region of the fin. The intermediate region of the fin may be between the gate region of the fin and the source/drain region of the fin. A gate may be formed over a gate region of a fin. The gate may contain a dielectric layer located above the fin, WF metal layers and a gate electrode located above it. A dummy spacer pair may be formed over the intermediate region, wherein the dummy spacer pair sandwiches the gate. The dummy spacer pair may contain at least two dummy spacers. An epi-layer may be formed above a source/drain region of the fin. The epi-layer may be in direct contact with the fin and the dummy spacer. The dummy spacer pair may be removed to create an implantation void. At least one dopant may be implanted into the intermediate region through the implantation void. The at least one dopant may be activated in the intermediate region.

An additional embodiment of the invention may include a semiconductor structure. The structure may include a semiconductor fin located on a substrate. The fin may contain a gate region of the fin, an intermediate region of the fin and a source/drain region of the fin. The intermediate region of the fin may be between the gate region of the fin and the source/drain region of the fin. A gate structure may be located above the gate region of the semiconductor fin. The gate structure may contain a dielectric layer located above the semiconductor fin, WF metal layers and an electrode located above it. An epi-layer may be located above the source/drain region of the semiconductor fin. A spacer may be located between the gate structure and the epi-layer and above the intermediate region of the fin. The intermediate region of the fin contains a different concentration of dopant from the gate region.

BRIEF DESCRIPTION OF THE SEVERAL DRAWINGS

Figure 1:
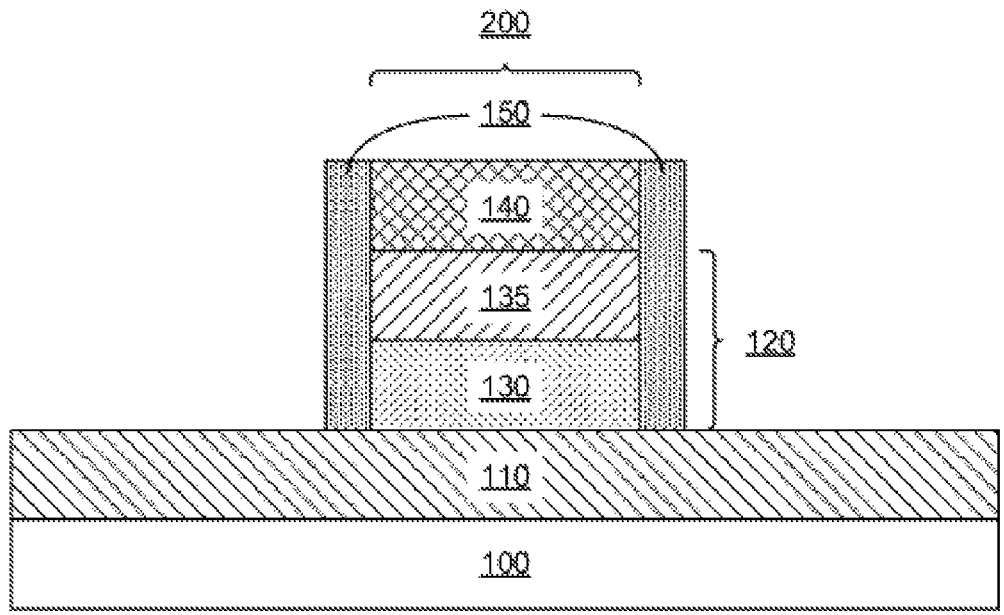
FIG. 1 is a cross sectional view of a semiconductor fin located on a substrate, and a dummy gate stack located on the semiconductor fin, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Doping and implantation of semiconductor fins may be used to manipulate the resulting structures that are formed. In doing so, it may be advantageous to place an intermediate region as close to a channel region as possible in order to improve device parameters (e.g. reduce resistance) of a gate structure. Additionally, by creating an intermediate region where there is a sharp junction profile (i.e. the distance from the maximum doping in the intermediate region of the fin to the minimum doping in the channel region of the fin is small) the device parameters may be improved. Sharp junction profiles may be created using ion implantation, however high temperature anneals used during the formation of subsequent device structure may cause dopants to diffuse and result in forming a graded junction, and thus degrading the device performance. The formation of a Replacement Metal Gate (RMG) typically includes a high temperature anneal processes, and thus any extension formation by ion implantation processes prior to the RMG step will lead to any implanted dopant to diffuse and form a graded junction. Thus by performing ion implantation after the RMG step an abrupt junction profile may be maintained.

Referring to FIG. 1, a fin 110 may be located above a substrate 100. FIG. 1, as well as FIGS. 2-6, illustrate a cross section along the length of a semiconductor fin. The fin 110 may have a width ranging from approximately 2 nm to approximately 40 nm, preferably approximately 4 nm to approximately 20 nm; a height ranging from approximately 5 nm to approximately 300 nm, preferably approximately 10 nm to approximately 80 nm. The fin 110 may be formed, for example by removing material from the substrate 100 using a photolithography process followed by an anisotropic etching process such as reactive ion etching (RIE) or plasma etching. Other methods of forming fins known in the art may also be utilized, such as sidewall image transfer (SIT).

In some embodiments, the substrate 100 may be either a bulk substrate or a semiconductor on insulator (SOI) substrate. In embodiments where the substrate 100 is a bulk substrate, the material of the fin 110 may be the same as the substrate 100 and there may be no identifiable boundary between the fin 110 and the substrate 100. The substrate 100 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In embodiments where the substrate 100 is an SOI substrate, the fins 110 may be formed from a top semiconductor layer separated from a base semiconductor substrate by a buried insulator layer (not shown). In such embodiments, the top semiconductor layer and the base semiconductor substrate may be made of the same materials as the bulk substrate discussed above. The buried insulator layer may have a thickness ranging from approximately 100 to approximately 500 nm, preferably about 200 nm. In such embodiments, the fin 110 may rest on the buried insulator layer, separated from the base semiconductor substrate.

Still referring to FIG. 1, a gate structure 200 may be located above the substrate 100, and cross over a portion of the fin 110. The gate structure 200 may be substantially perpendicular to the fin 110, where the fin 110 passes through the gate structure 200 in a gate region, and a source/drain region of the fin 110 may be located on both sides of the gate region. The gate structure 200 may contain a gate structure 120, and a hardmask 140. The gate structure 120 may have a height of approximately 40 nm to approximately 200 nm, preferably approximately 50 nm to approximately 150 nm. The gate structure 120 may include a gate dielectric 130 on the fin 110 and a gate electrode 135 on the gate dielectric 130 that may be formed via any known process in the art, including a gate-first process and a gate-last process. Additionally, a work function metal layer may be located between the gate dielectric 130 and gate electrode 135. In an example process flow, a gate-last process is used and is illustrated in FIG. 1-FIG. 6.

In a gate-first process, the gate dielectric 130 may include any suitable insulating material including, but not limited to: oxides, nitrides, oxynitrides or silicates including metal silicates and nitrided metal silicates. In one embodiment, the gate dielectric 130 may include a high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric 130 may be deposited over the fin 110 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The work function metal layer may include, for example, aluminum, lanthanum oxide, magnesium oxide, strontium titanate, strontium oxide, TiN, TaN. The gate electrode 135 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode 135 may be formed using any suitable metal deposition technique, including, for example, CVD, PVD, and ALD, sputtering, and plating.

In a gate-last process, the gate structure 120 may be a sacrificial gate structure, such as a dummy gate dielectric 130 and a dummy gate material 135, that may be later removed and replaced by a replacement gate dielectric, WF metal and a replacement gate electrode such as those of the gate-first process described above. In an example embodiment, the dummy gate material 135 may be made of a polysilicon material with the dummy gate dielectric 130 (e.g., silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

Still referring to FIG. 1, a spacer 150 may be formed adjacent to the exposed vertical surfaces of the gate structure 120, and cover a portion of the substrate 100 and the fin 110. The spacer 150 may be made of any suitable insulating material, such as silicon nitride, silicon oxide, silicon oxynitrides, or a combination thereof, and may have a thickness ranging from 2 nm to approximately 100 nm. In an example embodiment, the spacer 150 may be made of SiOCN and have a thickness ranging from approximately 2 nm to approximately 25 nm. The spacer 150 may be formed by any method known in the art, including depositing a conformal insulating layer over the gate structure 120 and anisotropically etching the material from the horizontal surfaces. Further, in various embodiments, the spacer 150 may include one or more layers.

In some embodiments, the hardmask 140 may be located above the gate structure 120. The hardmask 140 may be made of an insulating material, such as, for example, silicon nitride or silicon oxide, capable of protecting the gate structure 120 during subsequent processing steps. In embodiments where the substrate 100 is a bulk substrate, an insulating layer may be deposited around the base of the fin prior to forming the gate structure 120 to insulate the gate structure 120 from the substrate 100. Further, while only a single gate structure 120 is shown, some embodiments may include more than one gate above the fin 110.

Figure 2:
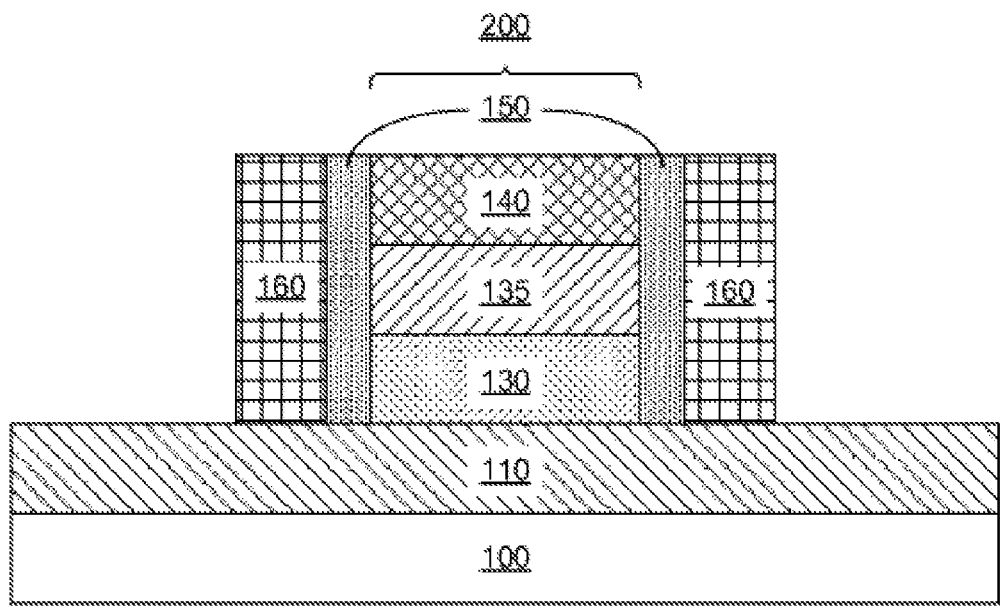
FIG. 2 is a cross sectional view following the formation of a dummy spacer, according to an example embodiment.

Referring to FIG. 2 a dummy spacer 160 may be formed adjacent to the spacer 150. The dummy spacer 160 may be formed directly adjacent to the spacer 150, and the dummy spacer 160 is in contact with the outer portion of the spacer 150. The spacer 150 and the dummy spacer 160 may cover an intermediate region of the fin. The dummy spacer 160 may be made of any material that may be selectively removed with respect to the spacer 150, and subsequently formed epi-layer 170. In some embodiments the dummy spacer 160 may be silicon nitride, silicon oxide, silicon oxynitrides, or a combination thereof, and may have a thickness ranging from 2 nm to approximately 100 nm. In an example embodiment, the spacer 150 may be made of SiBCN and have a thickness ranging from approximately 2 nm to approximately 25 nm, which may define the width of an implanted region that will be subsequently formed. The dummy spacer 160 may be formed by any method known in the art, including depositing a conformal insulating layer over the gate structure 200, and anisotropically etching the material from the horizontal surfaces. Further, in various embodiments, the dummy spacer 160 may include one or more layers.

Figure 3:
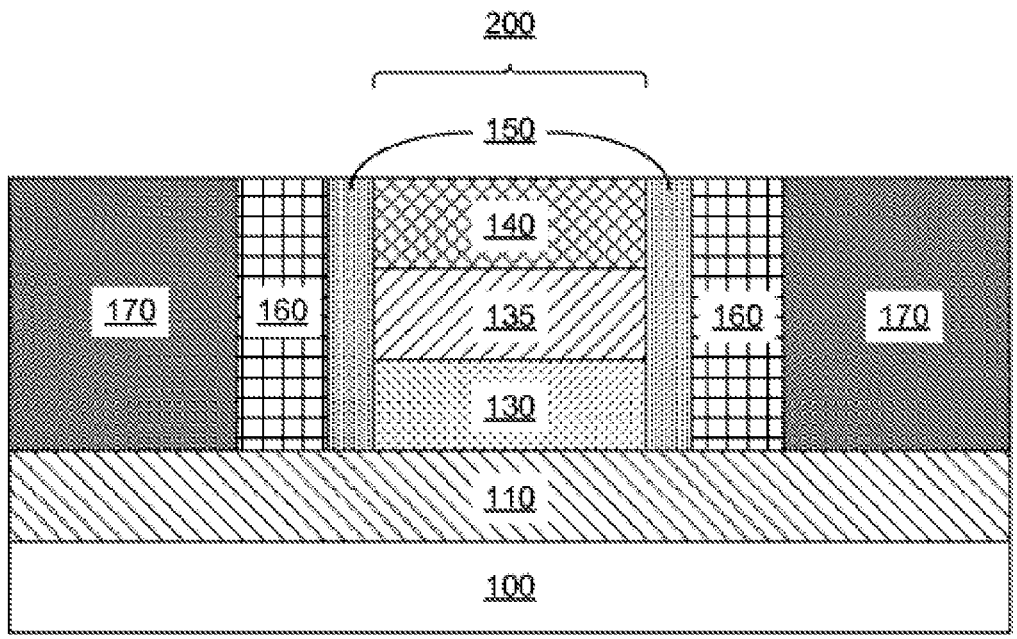
FIG. 3 is a cross sectional view following formation of a epi-layer, according to an example embodiment.

Referring to FIG. 3 epi-layer 170 is grown on a source/drain region of the fin 110. The epi-layer 170 may include a semiconductor material epitaxially grown on the fin and one or more insulating layers. Additionally, various other conditioning techniques or methods that may increase the device performance may be performed. In an example embodiment, all of the junction forming steps that are operated above 750° C. would be performed, in order to reduce the amount of dopant diffusion after the implantation that occurs in subsequent steps. In some embodiments, a semiconductor material may be epitaxially on the existing crystal lattice of the fin 110. In an example embodiment, the semiconductor material may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm$^3$ to approximately $2 \times 10^{21}$ atoms/cm$^3$.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 4:
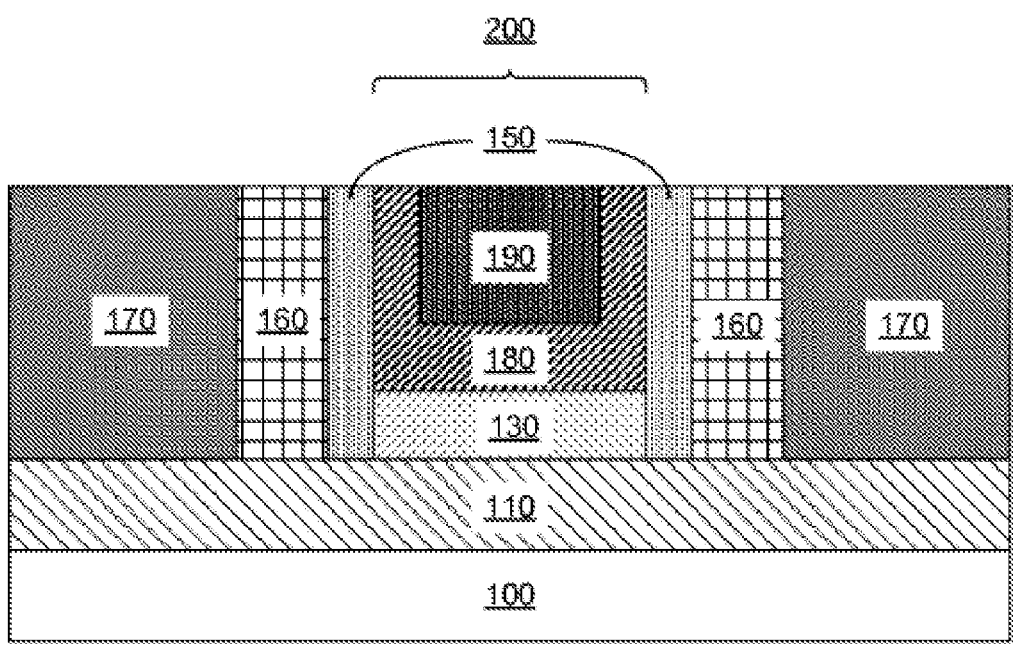
FIG. 4 is a cross sectional view following replacement of the dummy gate stack with a replacement metal gate stack, according to an example embodiment.
Figure 5:
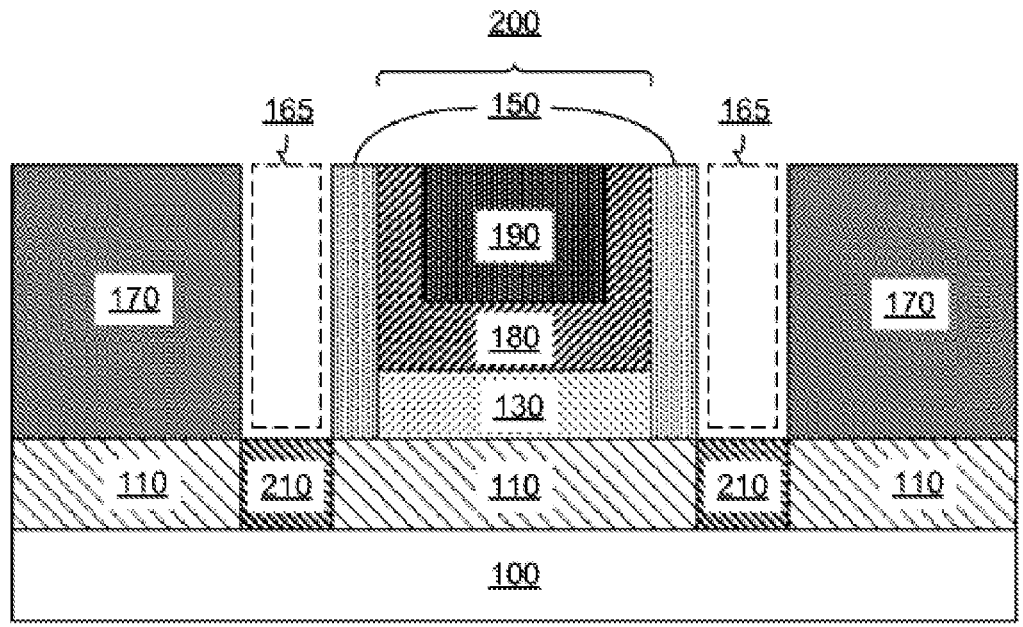
FIG. 5 is a cross sectional view following removal of the dummy spacer and implantation of ions into the semiconductor fin, according to an example embodiment.
Figure 6:
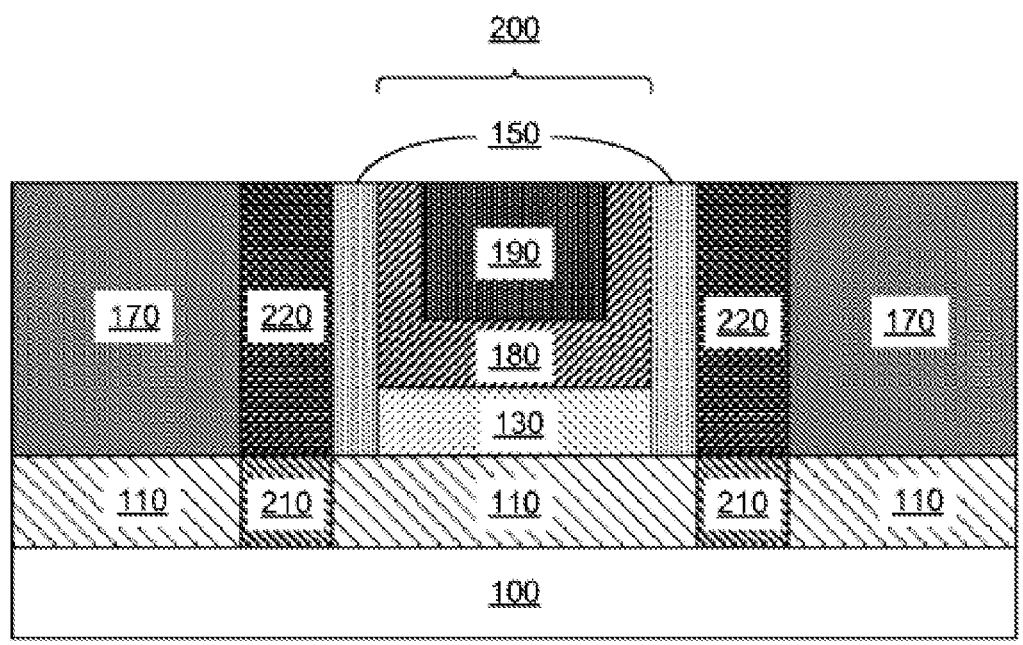
FIG. 6 is a cross sectional view following formation of an insulating layer, according to an example embodiment.
Figure 7:
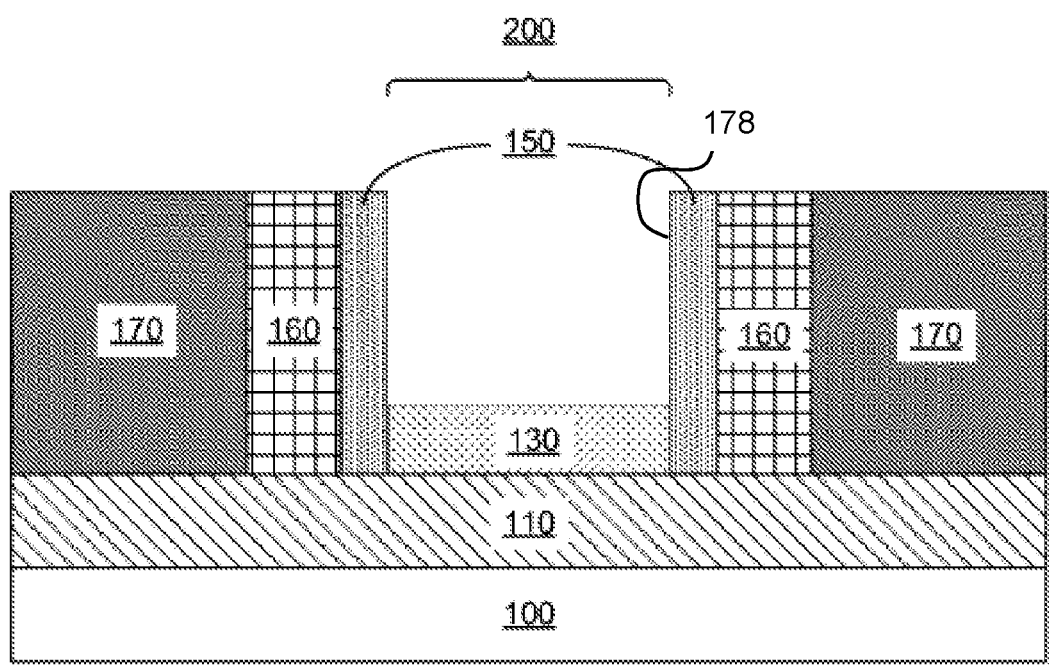
FIG. 7 is a cross sectional view following the removal of the dummy gate stack, according to an example embodiment.

Referring to FIG. 4, in a gate last process the dummy gate (i.e. the dummy material 135 and at least a portion of the dummy dielectric 130) may be replaced with a replacement metal gate (i.e. a replacement gate dielectric 180 (FIG. 4), work function layer and a replacement gate electrode 190 (FIG. 4)). The dummy gate may be removed by selectively etching the dummy gate using an isotropic or an anisotropic etching process such as, for example, reactive ion etching (RIE), wet etching or plasma etching (not shown), to create a gate void 178 as shown in FIG. 7. The chemicals and processes selected for the etch should be selected such that the dummy gate is removed, while the spacer, dummy spacer, epi-layer, and source/drain fin region remain substantially unaffected During etching, some or all of the dummy dielectric 130 may be removed. FIGS. 4-6 illustrate an embodiment where only a portion of dummy dielectric 130 is removed during the etch.

Following the removal of the dummy gate, a replacement gate dielectric 180 may be deposited in gate void 178 (FIG. 7). In one embodiment, the replacement gate dielectric 180 may include silicon oxide (SixOy) or a high-k oxide such as, for example, hafnium oxide (HfxOy), zirconium oxide (ZrxOy), aluminum oxide (AlxOy), titanium oxide (TixOy), lanthanum oxide (LaxOy), strontium titanium oxide (SrxTiyOz), lanthanum aluminum oxide (LaxAlyOz), and mixtures thereof. The replacement gate dielectric 180 may be deposited over the fin 110 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following the deposition of the replacement gate dielectric 180, in some embodiments a work function metal layer may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating.

In some embodiments, a high temperature anneal may be performed prior to the deposition of the gate electrode. The high temperature anneal may be performed in order to increase the performance of the replacement metal gate stack. The high temperature anneal may be performed at temperatures ranging from approximately 600° Celsius to approximately 1250° Celsius and may be annealed for approximately 0.1 to approximately 30 second. In some embodiments, the annealing temperature may be substantially uniform throughout the annealing period, however in other embodiments the annealing period include one or more ramping cycles where the temperature is decreased or increased. Following the anneal, additional work function metal layers, dielectric layer or any other layers known in the art may be deposited.

A replacement gate electrode 190 may be deposited above the gate dielectric 180 or work function layer in gate void 178. The replacement gate electrode 190 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The replacement gate electrode 190 may be formed using any suitable metal deposition technique, including, for example, CVD, PVD, and ALD, sputtering, and plating.

Referring to FIG. 5 removal of the dummy spacer 160 may be performed and dopant may be implanted into the fin 110 to create an intermediate region 210. The dummy spacer 160 may be removed, creating a dummy void 165, using an isotropic or an anisotropic etching process such as, for example, reactive ion etching (RIE), wet etching or plasma etching. The chemicals and processes selected for the etch should be selected such that the dummy spacer 160 is removed, while the spacer 150, replacement metal gate and epi-layer 170 remain substantially unaffected. In some embodiments, the chemicals and processes maybe be chemicals and processes that selectively etch nitrides with respect to oxides.

Following removal of the dummy spacer 160, an ion implantation (I/I) of a dopant or dopants is performed through implantation void 165. The ion implantation is performed to introduce desired dopants into the fin 110 adjacent to the channel region of the fin, where the channel region is located directly below the gate structure 200. In some embodiments, dopants may include any suitable semiconductor dopant such as, for example, but not limited to Boron, Arsenic, Phosphorus and combinations thereof. The dopant may be implanted in concentrations ranging from approximately $1\times10^{18}$ atoms/cm$^3$ to approximately $5\times10^{19}$ atoms/cm$^3$.

Referring to FIG. 6, the implantation void 165 (FIG. 5) may be filled with an insulating material to form a replacement spacer 220. The insulating material may be any dielectric material capable of being deposited into the implantation void 165. The insulating material may be deposited using a flowable chemical vapor deposition (FCVD) process, by first depositing a silicon precursor such as trisilylamine [TSA, $(SiH_3)_3N$] with an oxygen ($O_2$) and ammonia ($NH_3$) mixture. The TSA may be deposited at temperatures below approximately 50° C. to enhance formation of short-chain polymers on the surface of the structure resulting in a liquid-like flowable film capable of filling dense, high-aspect ratio re-entrant profiles, such as dummy void 165. After the low temperature deposition of TSA, the wafer may be steam annealed between approximately 350 to approximately 550° C. for approximately 2 to approximately 4 hours to allow dehydrogenation and denitrogenation of TSA leading to formation of silicon oxide ($SiO_2$) capable of filling dummy void 165 without leaving a substantial volume of voids. Any other suitable process may be used to fill the dummy void 165.

Following ion implantation and the void fill, the dopant species may be activated using an activation anneal. The activation anneal my be done using, for example, a high temperature milli-second flash anneal typically greater than 1000° C. or laser spike anneal (LSA), or any additional annealing process that does not contribute to dopant diffusion process. This may allow for the formation of an abrupt junction adjacent to the channel region.

The present embodiment may eliminate the use of high temperature anneals (e.g. greater than 750° C.) subsequent to the activation of dopants adjacent to the gate region. This may create a sharp junction profile between the intermediate region and the gate region of the fin due to the elimination of steps that would enable dopant migration from the intermediate region to the gate region.

Following the example embodiment, a semiconductor structure exists having a gate located above, and substantially perpendicular to, a semiconductor fin. The gate crosses the fin at a gate region of the fin. Adjacent to the gate is a first spacer and a second spacer located above an intermediate region of the fin (e.g. the region which underwent ion implantation of dopants). The first spacer and second spacer may sandwich the gate. Directly adjacent to the intermediate region of the fin is the source/drain region of the fin which contains a fin and an epi-layer grown on top of the fin, as well as any other structures that may be present prior to formation of metal vias on the source/drain region. Additionally, there may be an abrupt junction between the intermediate region and the gate region.

The abrupt junction may be defined by the distance over which a change in dopant concentration occurs. In an embodiment, the change in dopant concentration may be an order of magnitude concentration change using, for example, atoms/cm$^3$ as the units of concentration. In an embodiment, the abrupt junction may be measured from a first concentration such as, for example, above $1\times10^{19}$ atoms/cm$^3$, to a second concentration such as, for example, below $1\times10^{18}$ atoms/cm$^3$. The abrupt junction may be defined as the distance between the first concentration and the second concentration, which may be less than approximately 5 nm, more preferably less than approximately 2 nm.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for forming a finFET comprising:
forming a dummy gate over a fin in a gate region of the finFET, wherein the dummy gate comprises a dummy dielectric layer in direct contact with the fin and a dummy material above the dummy dielectric layer;
forming a gate spacer pair over the fin sandwiching the dummy gate, wherein the gate spacer pair is located above the fin in an intermediate region of the finFET, and wherein the intermediate region of the finFET is adjacent to the gate region of the finFET;
forming a dummy spacer pair adjacent to the gate spacer pair, wherein the dummy spacer pair sandwiches the dummy gate and the gate spacer pair, and wherein the dummy spacer pair is located above the fin in the intermediate region of the finFET;
forming an epi-layer above the fin in a source/drain region of the finFET, wherein the epi-layer is in direct contact with the dummy spacer pair and the source/drain region is adjacent to the intermediate region of the finFET;
removing at least the dummy material to form a gate void;
forming a replacement gate in the gate void, wherein forming the replacement gate comprises depositing a dielectric layer in the gate void and then depositing an electrode in the gate void;
removing the dummy spacer pair after forming the replacement gate to form an implantation void;
implanting at least one dopant through the implantation void and into the fin located in the intermediate region of the finFET;
filling the implantation void with an insulating material to form an insulating layer; and
activating the at least one dopant in the fin located in the intermediate region of the finFET.

2. The method of claim 1, wherein the implanted dopant comprises phosphorus, arsenic, boron or combinations thereof.

3. The method of claim 1, wherein activating the dopant comprises applying a millisecond flash anneal or a laser spike anneal to the fin located in the intermediate region of the finFET.

4. The method of claim 1, wherein the material forming the dummy spacer pair comprises a silicon nitride, a silicon oxide, or a silicon oxynitrides.

5. The method of claim 1, wherein the material forming the gate spacer pair comprises a silicon nitride, a silicon oxide, or a silicon oxynitrides.

6. The method of claim 1, wherein following activation the region of the fin located in the intermediate region of the finFET contains a first concentration of dopant and the region of the fin located in the gate region of the finFET contains a second concentration of dopant, and wherein there is at least an order of magnitude difference between the first concentration of dopant and the second concentration of dopant.

7. The method of claim 6, wherein the distance between the first concentration of dopant and the second concentration of dopant is less than about 5 nm.

8. The method of claim 6, wherein the second concentration of dopant is less than about $1\times10^{18}$ atoms/cm$^3$.

9. A method for forming a finFET comprising:
forming a fin on a semiconductor substrate, wherein a portion of the fin is located in a gate region of the finFET, a portion of the fin is located in an intermediate region of the finFET and a portion of the fin is located in a source/drain region of the finFET and wherein the intermediate region of the finFET is between the gate region of the finFET and the source/drain region of the finFET;
forming a gate, wherein forming the gate comprises forming a gate dielectric above the portion of the fin located in the gate region of the finFET and then forming a gate electrode above the gate dielectric;
forming a dummy spacer pair over the portion of the fin located in the intermediate region of the finFET, wherein the dummy spacer pair sandwiches the gate;
forming an epi-layer above the portion of the fin located in the source/drain region of the finFET, wherein the epi-layer is in direct contact with the fin and the dummy spacer;
removing the dummy spacer pair to create an implantation void;
implanting at least one dopant through the implantation void and into the portion of the fin located in the intermediate region of the finFET; and
activating the at least one dopant in portion of the fin located in the intermediate region of the finFET.

10. The method of claim 9, wherein the implanted dopants comprise phosphorus, arsenic, boron or combinations thereof.

11. The method of claim 9, wherein activating the dopant comprises applying a millisecond flash anneal or a laser spike anneal to the portion of the fin located in the intermediate region of the finFET.

12. The method of claim 1, wherein the material forming the dummy spacer pair comprises a silicon nitride, a silicon oxide, or a silicon oxynitrides.

13. The method of claim 1, wherein the material forming the gate spacer pair comprises a silicon nitride, a silicon oxide, or a silicon oxynitrides.

14. The method of claim 9, wherein following activation the portion of the fin located in the intermediate region of the finFET contains a first concentration of dopant and the portion of the fin located in the gate region of the finFET contains a second concentration of dopant, and wherein there is at least an order of magnitude difference between the first concentration of dopant and the second concentration of dopant.

15. The method of claim 14, wherein the distance between the first concentration of dopant and the second concentration of dopant is less than about 5 nm.

16. The method of claim 14, wherein the second concentration of dopant is less than about $1\times10^{18}$ atoms/cm$^3$.

* * * * *